United States Patent
Lin et al.

(10) Patent No.: US 6,653,998 B2
(45) Date of Patent: Nov. 25, 2003

(54) LCD DRIVER FOR LAYOUT AND POWER SAVINGS

(75) Inventors: Shi-Tron Lin, Taipei (TW); Yung-Peng Hwang, Taipei (TW)

(73) Assignee: Winbond Electronics Corp. (TW)

( * ) Notice: Subject to any disclaimer, the term of this patent is extended or adjusted under 35 U.S.C. 154(b) by 237 days.

(21) Appl. No.: 09/740,223

(22) Filed: Dec. 19, 2000

(65) Prior Publication Data

US 2002/0113767 A1 Aug. 22, 2002

(51) Int. Cl.[7] ............................. G09G 3/36; G09G 5/10; G11C 8/10; H03M 1/80
(52) U.S. Cl. .................... 345/98; 345/204; 345/690; 345/692; 365/230.06; 326/107; 341/152; 341/153
(58) Field of Search ................... 345/98, 204, 205, 345/211, 215, 690, 692; 326/105–108, 102; 327/408; 257/776; 365/63, 104, 230.06; 341/144, 153, 154

(56) References Cited

U.S. PATENT DOCUMENTS

| | | | | |
|---|---|---|---|---|
| 5,198,747 A | * | 3/1993 | Haight | 323/303 |
| 5,446,700 A | * | 8/1995 | Iwase | 365/230.06 |
| 5,574,475 A | * | 11/1996 | Callahan, Jr. et al. | 345/100 |
| 5,703,617 A | * | 12/1997 | Callahan, Jr. et al. | 345/98 |
| 6,344,814 B1 | * | 2/2002 | Lin et al. | 341/144 |
| 2001/0028336 A1 | * | 10/2001 | Yamagata et al. | 345/98 |
| 2002/0100925 A1 | * | 8/2002 | Hsiao et al. | 257/258 |

* cited by examiner

*Primary Examiner*—Bipin Shalwala
*Assistant Examiner*—David L. Lewis
(74) *Attorney, Agent, or Firm*—Raymond Sun (57) ABSTRACT

A driver circuit for use in driving displays has an input receiving a digital input data having n bits for selecting one of a plurality of voltage levels for driving the circuit. The circuit also has an output, a plurality of digital signal lines coupled to the digital input data, and a plurality of active regions coupled to a first side of the output. Each of the plurality of active regions is coupled to a separate voltage level. The circuit further includes a plurality of pass transistors at a first subset of locations where the plurality of digital signal lines overlap the plurality of active regions, and a plurality of depletion-implanted transistors at a second subset of locations where the plurality of digital signal lines overlap the plurality of active regions. The number of the plurality of digital signal lines on one side of the output can be odd number, such as 2n−1, or can be 2n−2. A plurality of blocking transistors can positioned between the input and selected digital signal lines, with at least one of the digital signal lines being coupled to a gate of each of the blocking transistors for controlling each of the blocking transistors. A level-shifter can also be positioned between selected active regions for one or more digital signal line.

32 Claims, 10 Drawing Sheets

LCD DRIVER FOR LAYOUT AND POWER SAVINGS

BACKGROUND OF THE INVENTION

1. Field of the Invention

The present invention relates generally to liquid crystal display (LCD) drivers, and more particularly, to digital signal control circuits and methods for conserving power and minimizing layout space for use with LCD drivers.

2. Background Art

LCD displays are commonly used for applications such as computer display monitors, television monitors, and other devices for displaying text, photo, video, or other types of information. LCD displays may be made of certain types of liquid crystal display material, as is well understood by those familiar with display technologies. In typical LCDs, liquid crystal material fills the space or gap between a pair of row and column substrates to form a cell or pixel. Perpendicular row and column electrodes are patterned on to the respective substrates to permit an electric potential to be selectively created at particular points (i.e., cells) on the display to alter the appearance of the liquid crystal material. Row and column (data) drivers are utilized to address selected cells.

Figure 1:
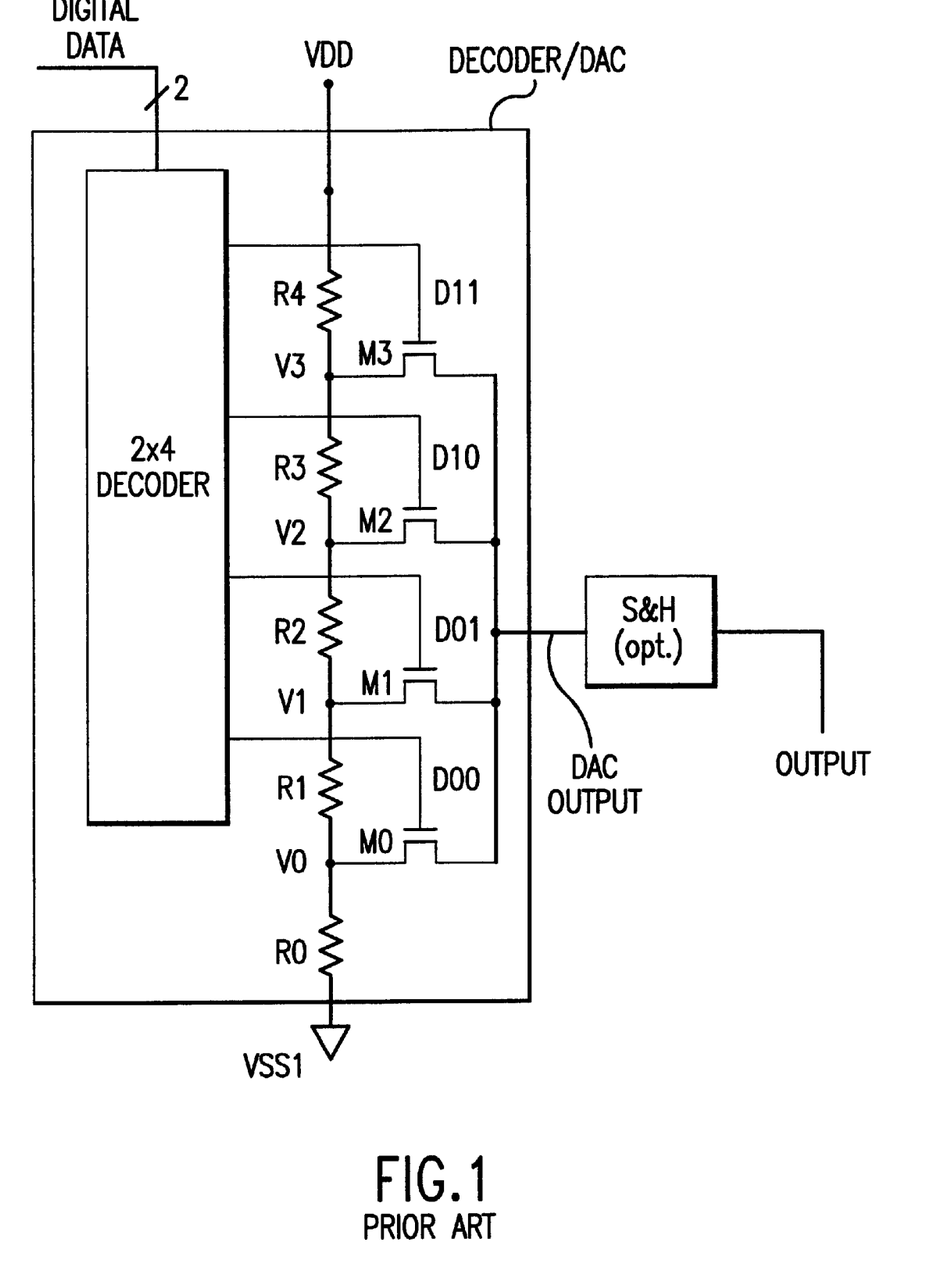
FIG. 1 illustrates a conventional LCD driver circuit.

Each of these LCD (row and column) drivers receive an n-bit digital input data that is used to select one out of $2^n$ voltage levels to be provided to the desired row or column electrodes. FIG. 1 illustrates a conventional LCD driver circuit where n is equal to 2. The 2-bit input data is processed by a 2×4 decoder for selecting one of the four digital lines {D00, D01, D10, D11} to pass one of the four voltage levels {V0, V1, V2, V3} to an output circuit and then on to the desired electrode. An optional sample and hold circuit designated S&H is provided at the output for boosting the signal strength of the output analog voltage.

Figure 2:
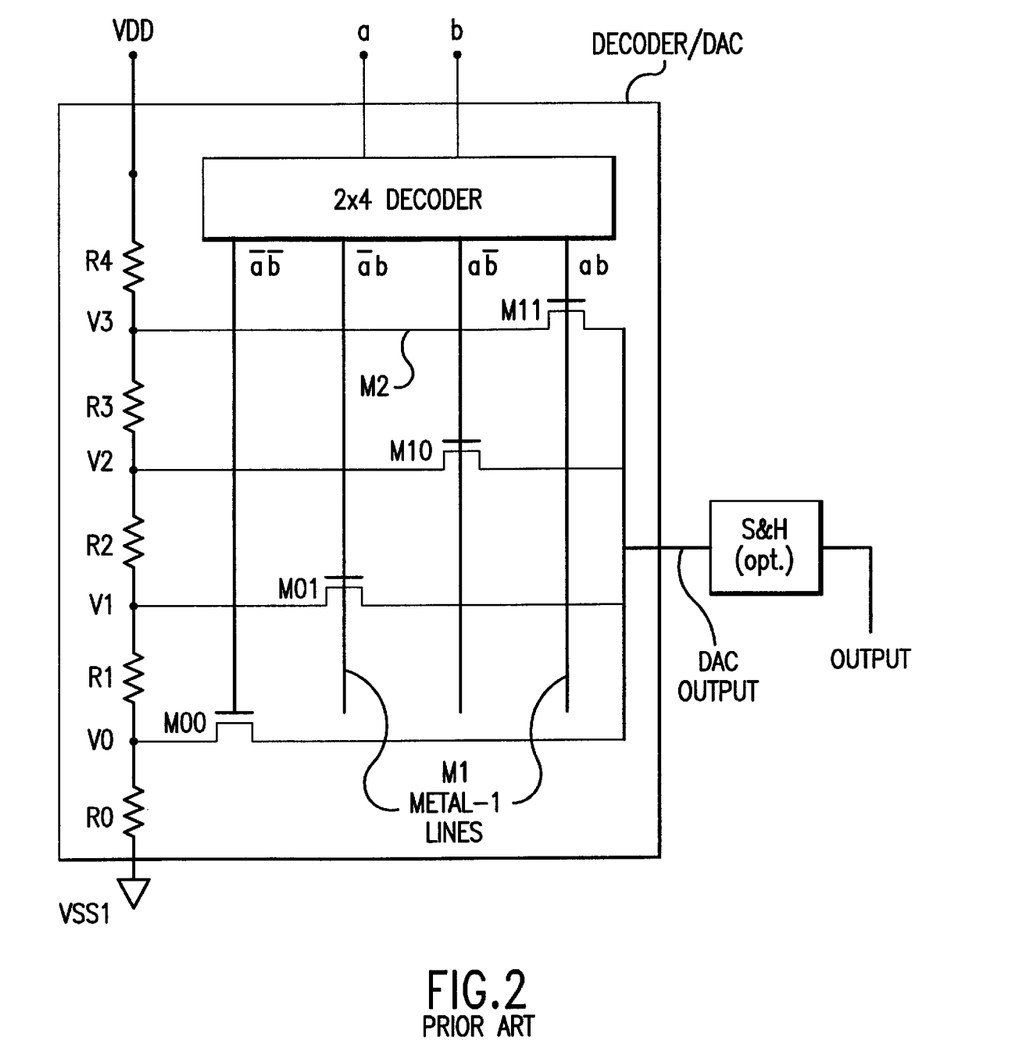
FIG. 2 illustrates a signal-line routing scheme based on the conventional LCD driver in FIG. 1.

FIG. 2 illustrates a known signal-line routing scheme based on the conventional LCD driver in FIG. 1. The four voltage lines carrying the voltage levels {V0, V1, V2, V3} are M2 (metal-2) lines, and the four decoded lines for carrying the decoded digital signals are M1 (metal-1) lines. The M2 and M1 lines are arranged perpendicular to each other. The output is used for driving one column of the LCD cells. The M2 lines that carry the analog voltages {V0, V1, V2, V3} extend further from what is illustrated in FIG. 2, and are used to drive other columns of LCD cells via other decoders.

Figure 3:
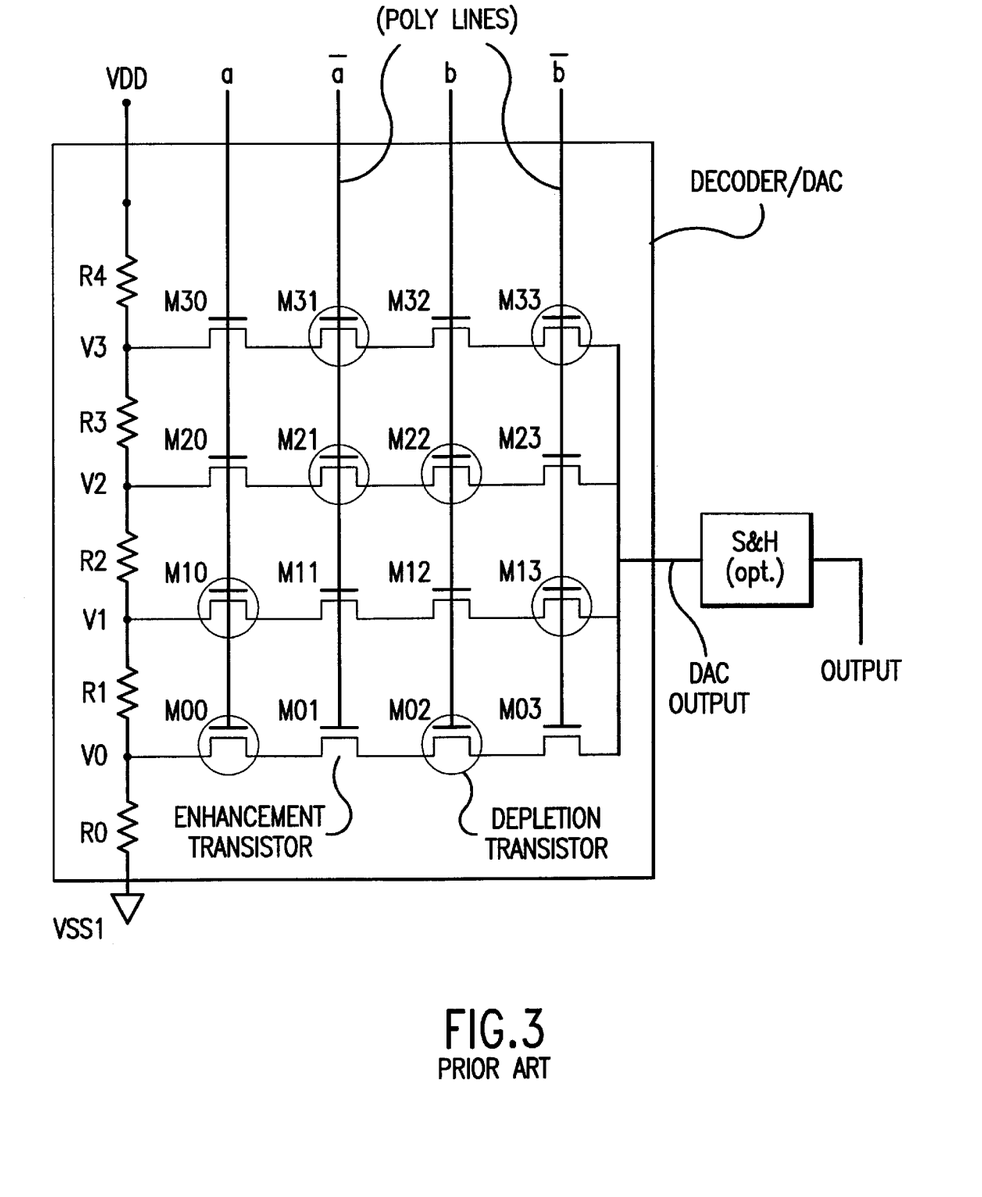
FIG. 3 illustrates a LCD driver circuit and routing scheme for a commercial LCD driver.

FIG. 3 illustrates the LCD driver circuit and routing scheme that is similar to a commercial LCD driver distributed by NEC Corp., and known as the "NEC uPD16632". For simplicity, only n=2 bits are shown in FIG. 3 to select one of four voltage levels for output driving. There are 2n (i.e., 4) digital signal lines {a, a-bar, b, b-bar} that are used for controlling a matrix of 2n×$2^n$ (i.e., 16) pass transistors, for selecting one of $2^n$ (i.e., 4) voltage levels as the output voltage. As compared with FIGS. 1 and 2, no decoder is used to process the digital input data. The voltage levels {V0, V1, V2, V3} are carried by metal lines that are fabricated by a metal-1 or metal-2 layer. The $2^n$ digital signal lines are carried by polysilicon lines that are perpendicular to the metal lines. Due to the column pitch and metal/polysilicon line pitch considerations, even though the number of pass transistors {M00, M01, . . . , M33} used is significantly higher than illustrated in FIGS. 1 and 2, the actual layout is not necessarily larger, and can actually be smaller, than the layout in FIGS. 1 and 2.

The pass transistors in FIG. 3 that have been circled (i.e., M00, M02, M10, M13, M21, M22, M31, M33) are deple-tion implanted to a negative threshold voltage so that they are always turned "ON" regardless of the voltage level (i.e., high or low) of each digital signal line {a, a-bar, b, b-bar}. In other words, these depletion implanted transistors operate as "don't care" transistors that pass whatever voltages are transmitted therethrough. The negative threshold voltage of these depletion implanted pass transistors enables the use of polysilicon lines as both the digital signal lines and the gates of those pass transistors to achieve savings in layout. This will become apparent by viewing the layout shown in FIG. 4.

Figure 4:
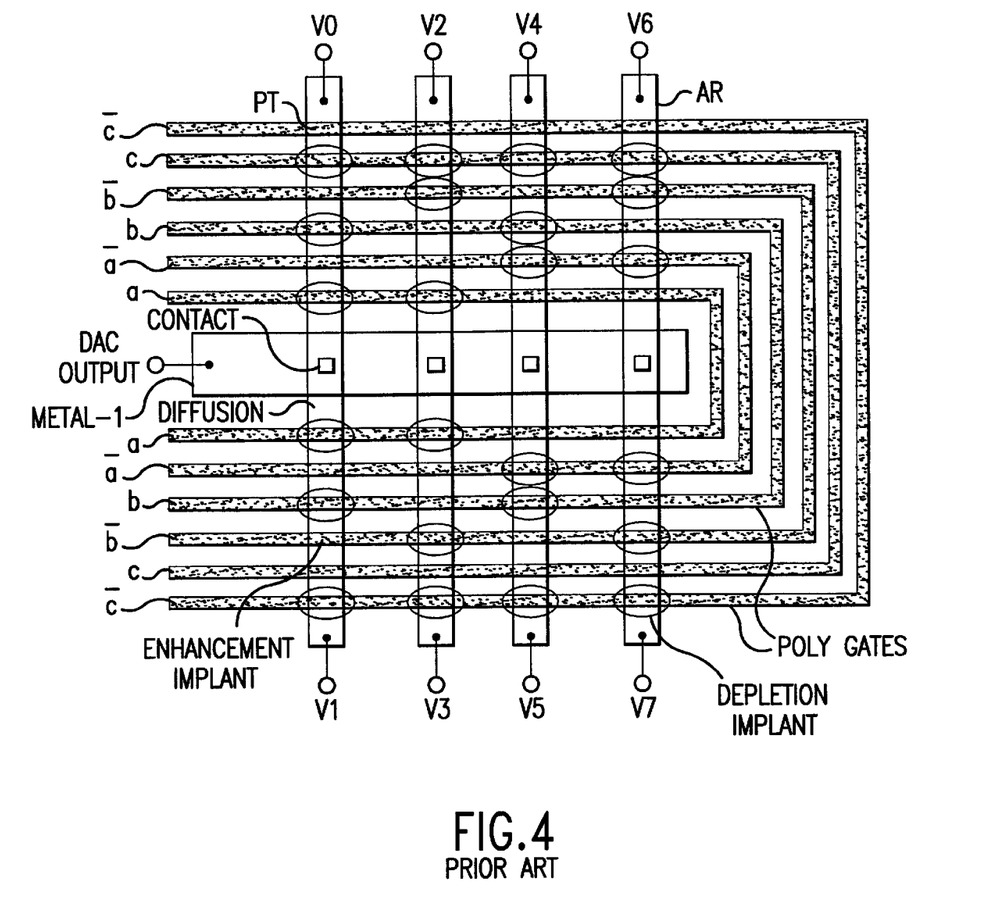
FIG. 4 is a top view of the layout of FIG. 3.

FIG. 4 is a top view of a layout that is similar to the layout of the NEC uPD16632 of FIG. 3. In this example, n=3 bits are used. As a result, there are 2n (i.e., 6) digital signal lines {a, a-bar, b, b-bar, c, c-bar}, and $2^n$ (i.e., 8) voltage levels {V0, V1, V2, V3, V4, V5, V6, V7}. These eight voltage levels are carried by eight active regions labeled AR that include diffusion regions (e.g., n+ implanted). As known in the art, a diffusion region is an n+ or p+ implanted and later diffused region (due to thermal cycles) in an active region surrounded by field oxide isolation. These eight voltage levels {V0, V1, V2, V3, V4, V5, V6, V7} are divided into even-numbered voltage levels {V0, V2, V4, V6} at one side of the layout of FIG. 4, and odd-numbered voltage levels {V1, V3, V5, V7} at another side of the layout of FIG. 4. A DAC output node is coupled to the action regions AR through metal-1 lines and metal-to-diffusion contacts. The six digital signal lines {a, a-bar, b, b-bar, c, c-bar} are carried by polysilicon lines, with six digital signal lines {a, a-bar, b, b-bar, c, c-bar} on a different side of the layout. A pass transistor PT is formed where each polysilicon line {a, a-bar, b, b-bar, c, c-bar} crosses an active region AR, with the portion of the polysilicon overlapping the active region AR as the gate for the pass transistor. Again, each circled pass transistor is depletion implanted through the use of a mask.

As shown in FIG. 4, the voltage levels {V0, V1, V2, V3, V4, V5, V6, V7} increase monotonously from V0 through V7. For example, V0 will be selected as the output voltage if {a}, {b} and {c} are all digital "low" (i.e., 0). This is because the {a}, {b} and {c} lines overlap depletion implanted transistors at the voltage level for V0 (i.e., the voltage V0 passes through), and the {a-bar}, {b-bar} and {c-bar} lines will carry a "high" signal (i.e., a=0, b=0, c=0) to pass the voltage level V0 to the DAC output. As a further example, V1 will be selected as the output voltage if {a} and {b} are all digital "low" (i.e., 0), and {c} is digital "high". This is because the {a}, {b} and {c-bar} lines overlap depletion implanted transistors at the voltage level for V1 (i.e., the voltage V1 passes through), and the {a-bar}, {b-bar} and {c} lines will carry a "high" signal (i.e., a=0, b=0, c 32 1) to pass the voltage level V1 to the DAC output. As yet another example, V6 will be selected as the output voltage if {c} is digital "low" (i.e., 0), and {a} and {b} are both digital "high". This is because the {a-bar}, {b-bar} and {c} lines overlap depletion implanted transistors at the voltage level for V6 (i.e., the voltage V6 passes through), and the {a}, {b} and {c-bar} lines will carry a "high" signal (i.e., a=1, b=1, c=0) to pass the voltage level V6 to the DAC output. Using the same methodology, and given the layout illustrated in FIG. 4, the corresponding digital signals and selected voltage levels are as follows:

| a | b | c | Voltage Level Selected |
|---|---|---|---|
| 0 | 0 | 0 | V0 |
| 0 | 0 | 1 | V1 |
| 0 | 1 | 0 | V2 |
| 0 | 1 | 1 | V3 |
| 1 | 0 | 0 | V4 |
| 1 | 0 | 1 | V5 |
| 1 | 1 | 0 | V6 |
| 1 | 1 | 1 | V7 |

Unfortunately, the layouts in FIGS. 3 and 4 suffer from the drawbacks that they take up much space, and require a large amount of power for driving the circuit.

SUMMARY OF THE INVENTION

It is an object of the present invention to provide an improved digital signal control circuit that conserves power.

It is another object of the present invention to provide an improved digital signal control circuit that conserves layout space.

It is a further object of the present invention to provide an improved digital signal control circuit that has fewer or reduced signal lines.

Improvements are needed to reduce the number of poly lines and pass transistors to save both layout space and power. As the gate of each pass transistor becomes a load for the {a, a-bar, b, b-bar, c, c-bar} signal driving lines, reduction of the poly lines and pass gates will reduce power consumption.

In accordance with the foregoing and other objectives of the invention, the present invention provides a driver circuit for use in driving displays, the circuit having an input receiving a digital input data having n bits for selecting one of a plurality of voltage levels for driving the circuit. The circuit also has an output, a plurality of digital signal lines coupled to the digital input data, and a plurality of active regions coupled to a first side of the output. Each of the plurality of active regions is coupled to a separate voltage level. The circuit further includes a plurality of pass transistors at a first subset of locations where the plurality of digital signal lines overlap the plurality of active regions, and a plurality of depletion-implanted transistors at a second subset of locations where the plurality of digital signal lines overlap the plurality of active regions. It is also possible to provide a second plurality of active regions coupled to a second side of the output.

In one embodiment of the present invention, the number of the plurality of digital signal lines on one side of the output is an odd number, and can be 2n–1.

In another embodiment of the present invention, the number of the plurality of digital signal lines on one side of the output can be 2n–2.

In yet another embodiment of the present invention, a plurality of blocking transistors are positioned between the input and selected digital signal lines, with at least one of the digital signal lines being coupled to a gate of each of the blocking transistors for controlling each of the blocking transistors.

In yet another embodiment of the present invention, a level-shifter can be positioned between selected active regions for one or more digital signal line.

The improvements set forth in these embodiments are directed primarily to conserving power and layout space.

BRIEF DESCRIPTION OF THE DRAWINGS

The invention can be more fully understood by reading the subsequent detailed description of the preferred embodiments, with reference made to the accompanying drawings.

DETAILED DESCRIPTION OF THE INVENTION

In the following description, for purposes of explanation and not limitation, specific details are set forth in order to provide a thorough understanding of the present invention. However, it will be apparent to one skilled in the art that the present invention may be practiced in other embodiments that depart from these specific details. In certain instances, detailed descriptions of well-known or conventional data processing techniques, hardware devices and circuits are omitted so as to not obscure the description of the present invention with unnecessary detail.

The present invention provides a number of improvements to conventional LCD driver circuits and routing schemes, such as those for the commercial LCD driver of FIGS. 3 and 4. Even though the embodiments of the present invention will be illustrated using the basic circuits, layout and routing scheme shown in FIGS. 3 and 4, this is not intended to limit the scope of the principles of the present invention, which can be applied to numerous other circuits, layouts and routing schemes. Each of the improvements set forth in the present invention in FIGS. 5–10 can be implemented alone, or combined with one or more of the other improvements. The improvements set forth herein are directed primarily to conserving power and layout space, although other objectives will become apparent to those skilled in the art.

First Embodiment

Figure 5:
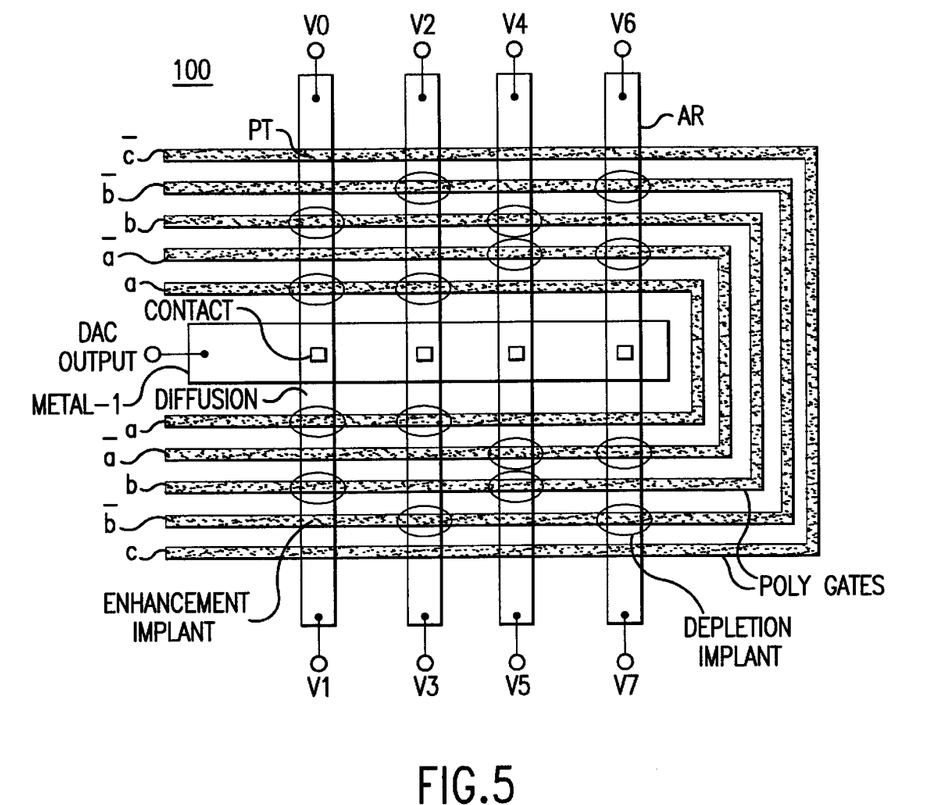
FIG. 5 is a top view of a layout for a driver circuit according to one embodiment of the present invention.

FIG. 5 illustrates a first possible improvement, which attempts to reduce the number of signal lines, thereby conserving space in the layout. This embodiment is based on the principle of utilizing a first digital signal to select or decode half of the analog voltage lines, and the use of the inverted first digital signal to select or decode the other half of the analog voltage lines, while using the combination of the other digital signals to select one from the selected half of the analog voltage lines. As used herein, the term "voltage line" is used to denote the line on which a voltage level is being delivered.

The layout 100 in FIG. 5 is essentially the same as in FIG. 4, except that the signal line {c} has been omitted or eliminated for the even-numbered voltage levels {V0, V2, V4, V6} on one side, and the signal line {c-bar} has been omitted or eliminated for the odd-numbered voltage levels {V1, V3, V5, V7} on the other side. The signal line {c} can be eliminated for the even-numbered voltage levels {V0, V2, V4, V6} because depletion implanted transistors are provided at all the overlaps between the even-numbered voltage levels {V0, V2, V4, V6} and the signal line {c}. Similarly, the signal line {c-bar} can be eliminated for the odd-numbered voltage levels {V1, V3, V5, V7} because depletion implanted transistors are provided at all the overlaps between the odd-numbered voltage levels {V1, V3, V5, V7} and the signal line {c-bar}. In other words, the signal line {c} is useless for the selection of even-numbered voltage levels {V0, V2, V4, V6}, and the signal line {c-bar} is useless for the selection of odd-numbered voltage levels {V1, V3, V5, V7}. This improvement can be achieved because each of the signal lines {c} and {c-bar} crosses only half of the eight active regions AR.

Even though FIG. 5 illustrates the elimination of the signal lines {c} (for the upper side of FIG. 5) and {c-bar} (for the lower side of FIG. 5), this is for illustrative purposes only and is based on the specific layout shown in FIG. 5. Depending on the layout selected by the circuit designer, any one or more of the other digital signal lines {a, a-bar, b, b-bar, c, c-bar} can be eliminated if the same conditions are met (e.g., depletion implanted transistors at all the overlaps).

Thus, the layout 100 in FIG. 5 eliminates one signal line on either side of the output, so that only a total of 2n–1 lines are now needed on each side. This reduction in signal lines helps to conserve space and minimizes the power consumption of the driver circuit.

Second Embodiment

Figure 6:
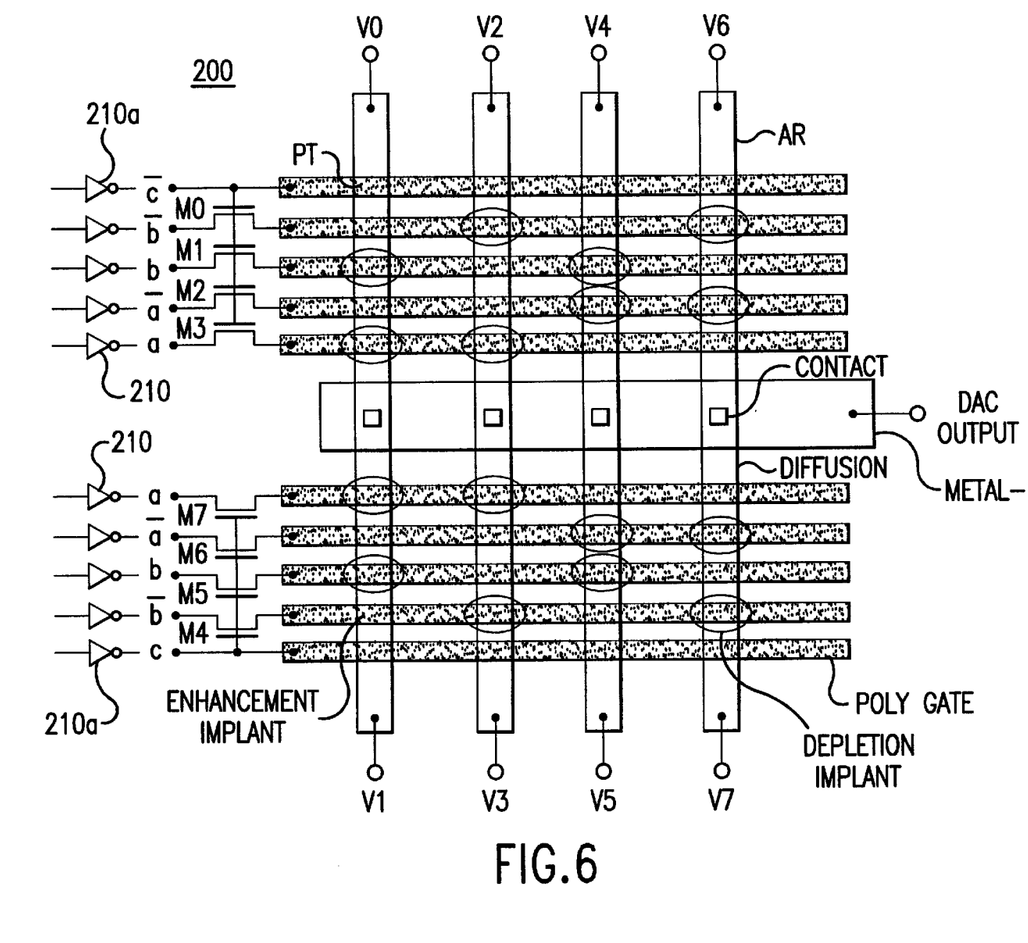
FIG. 6 is a top view of a layout for a driver circuit according to another embodiment of the present invention.

FIG. 6 illustrates another possible improvement, which attempts to block a subset of the digital signals from propagating to certain pass transistors, thereby conserving power. In this regard, it is well-known that when CMOS gates are used, power consumption results whenever a CMOS gate changes its logic level. Therefore, this embodiment is based on the principle of anticipating the circumstances under which certain pass transistors will not be needed, and then blocking the transmission of digital signals to these pass transistors so that these pass transistors will not need to experience a change in logic level. In other words, one or more digital signal lines are blocked based on the logic state of one or more other digital signal lines.

The layout 200 in FIG. 6 is essentially the same as in FIG. 5, except that additional pass transistors M0, M1, M2, M3, M4, M5, M6, M7 (referred to hereinafter as "blocking transistors") have been provided to block certain digital signals from propagating to the digital line decoding area. The digital line decoding area is defined as the area formed by the overlapping digital lines and active regions AR associated with analog voltage levels. In FIG. 6, it can be seen that when the signal {c-bar} is logic "low" (i.e., signal {c} is logic "high"), none of the even-numbered voltage levels {V0, V2, V4, V6} on one side of FIG. 6 will be selected as the output. As a result, if {c-bar} is logic "low", it would be a waste of power to have the digital signals {a, a-bar, b, b-bar} still propagate to the pass transistors PT associated with the even-numbered voltage levels {V0, V2, V4, V6} in the upper side of FIG. 6, since these pass transistors will still change logic levels (and consume power) even though they will be not be able to select any of these even-numbered voltage levels {V0, V2, V4, V6}. Thus, blocking transistors M0, M1, M2, M3 are provided at the inputs of the digital signals {a, a-bar, b, b-bar}, respectively, on one side of FIG. 6 to block these digital signals from propagating into the digital line decoding area if the signal {c-bar} is logic "low".

Similarly, it can be seen that when the signal {c} is logic "low", none of the odd-numbered voltage levels {V1, V3, V5, V7} on the other side of FIG. 6 will be selected as the output. Thus, blocking transistors M4, M5, M6, M7 are provided at the inputs of the digital signals {b-bar, b, a-bar, a}, respectively, on the other side of FIG. 6 to block these digital signals from propagating into the digital line decoding area if the signal {c} is logic "low". The blocking transistors {M0, . . . , M7} can be provided in the form of NMOS switching gates.

In addition, signal-driving buffers 210 can be coupled to the blocking transistors {M0, . . . , M7} at the digital signal inputs to amplify each digital signal {a, a-bar, b, b-bar, c, c-bar} before they are used to drive the pass transistors PT. Since the {c} and {c-bar} signals must change faster than the other digital signals {a, a-bar, b, b-bar} in order to cause the blocking transistors {M0, . . . , M7} to turn on more quickly (for blocking selected digital signals), larger buffers 210a can be used to drive the signals c and c-bar than the other buffers 210. These buffers 210, 210a can be provided in the form of an inverter, as shown in FIG. 6, although any other conventional signal driving buffer can also be utilized.

As another alternative, CMOS transfer gates may be used instead of the blocking transistors {M0, . . . , M7} to preserve the full logic swing of the digital signals {a, a-bar, b, b-bar} when these digital signals pass therethrough.

Even though FIG. 6 illustrates the provision of the blocking transistors {Mo. . . , M7} together with the principle of reducing the number of digital lines as shown in FIG. 5, it is also possible to apply the principles of FIG. 6 independently without the reduction of signal lines. In addition, even though FIG. 6 illustrates the use of the signal lines {c} and {c-bar} to control the blocking transistors {M0, . . . , M7}, this is for illustrative purposes only and is based on the specific layout shown in FIG. 6. Depending on the layout selected by the circuit designer, any one or more of the six digital signal lines {a, a-bar, b, b-bar, c, c-bar} can be used for controlling the blocking transistors {M0, . . . , M7}.

Third Embodiment

Figure 7:
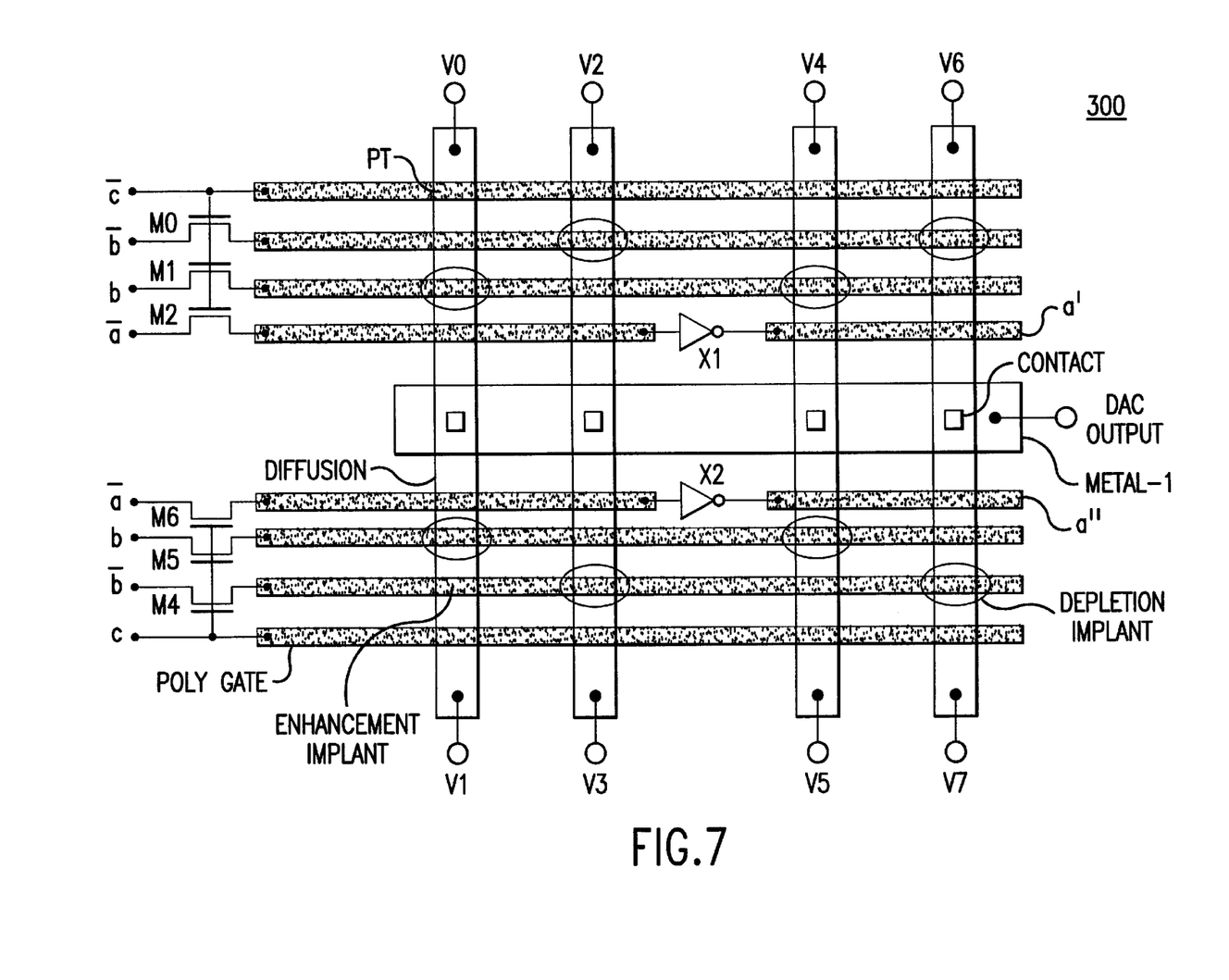
FIG. 7 is a top view of a layout for a driver circuit according to yet another embodiment of the present invention.

FIG. 7 illustrates another possible improvement, which attempts to further reduce the number of digital signal lines. This embodiment is also based on the same principles of FIG. 5, but also including the principle of using a digital signal for selecting or decoding one range of voltage levels, and an inverter associated with the digital signal for selecting or decoding a different range of voltage levels. In other words, this embodiment utilizes (explained in greater detail below):

1. a first signal poly line (e.g., {c}) for selecting/decoding a first subset of voltage levels (e.g., V1, V3, V5, V7);
2. an inverted first signal poly line (e.g., {c-bar}) for selecting/decoding a second subset (complementary to the first subset) of voltage levels (e.g., V0, V2, V4, V6);
3. a second signal poly line (e.g., {a-bar}) for selecting/decoding a third subset of voltage levels (e.g., V0, V1, V2, V3) partly from the first subset, and partly from the second subset, of voltage levels; and
4. an inverted second signal poly line (e.g., {a'} and {a"}) for selecting/decoding a fourth subset (complementary to the third subset) of voltage levels (e.g., V4, V5, V6, V7) partly from the first subset, and partly from the second subset, of voltage levels.

The layout 300 in FIG. 7 is essentially the same as in FIG. 6, except that the signal lines {a} and {a-bar} each goes only half-way, and so both share one poly line pitch. Referring back to FIG. 4, it can be seen that a logic "high" for the signal {a-bar} selects one of the voltage levels {V0, V1, V2, V3}, and that a logic "high" for the signal {a} selects one of the voltage levels {V4, V5, V6, V7}. Based on this characteristic, the pitch for the original signal line {a} can be eliminated, and inverting gates X1 and X2 (which in one embodiment can be CMOS gates) can be positioned on the signal lines {a-bar} between the active regions for voltage levels V2 and V4, and between the active regions voltage levels V3 and V5, respectively. This positioning of the inverting gates X1 and X2 allows the signal {a-bar} to only propagate to the active regions for the lower voltage levels {V0, V1, V2, V3}. The inverting gates X1 and X2 will invert the {a-bar} signal to the signals {a'} and {a"} (which are actually the same as the signal {a}) which then propogate to the active regions for the upper voltage levels {V4, V5, V6, V7}.

If the input of the inverting gate X1 turns into an undesirable floating state after the signal line {a-bar} is cut off by the blocking transistor M2, it can cause excess power consumption for the inverting gate X1. For example, if the inverting gate X1 is a CMOS inverter, and if the input voltage at the gate X1 is not at "high" or "low", then both the pull-up PMOS and pull-down NMOS are partly turned on. This results in a "crowbar" current that goes straight from VDD to VSS causing power loss. To avoid this problem, the inverting gate X1 can be configured as shown in FIG. 8a or 9a, such that when the signal {c-bar} is at logic "low", no crowbar current can flow directly from VDD to VSS as a result of a floating input (i.e., {a-bar}) of inverting gate X1.

Figure 8A:
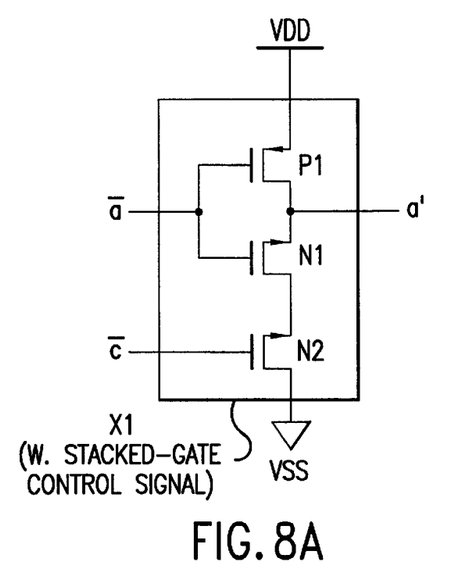
FIGS. 8a, 8b, 9a and 9b illustrate different inverting gates that can be used with the circuit of FIG. 7.
Figure 9A:
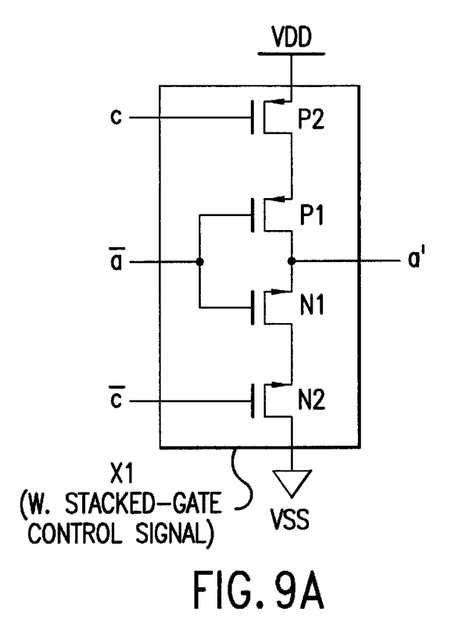

Referring to FIG. 8a, since the input to gate X1 is floating only when the signal {c-bar} is at "low", by using {c-bar} to cut off N2 in the gate X1 when {c-bar} is at "low", the current path from VDD to VSS in gate X1 will be blocked, so that there will be no "crowbar" current even if the input to gate X1 is floating. The signal {a'} might be floating or pulled high by the partially turned on P1, but this will not cause much power consumption. Similarly, in the embodiment of FIG. 9a, when the signal {c-bar} is at "low" and the signal {c} is at "high", both N2 and P2 are cut off, so that there will be no "crowbar" current even if the input to gate X1 is floating, and the signal {a'} line will not be charged by VDD.

Figure 8B:
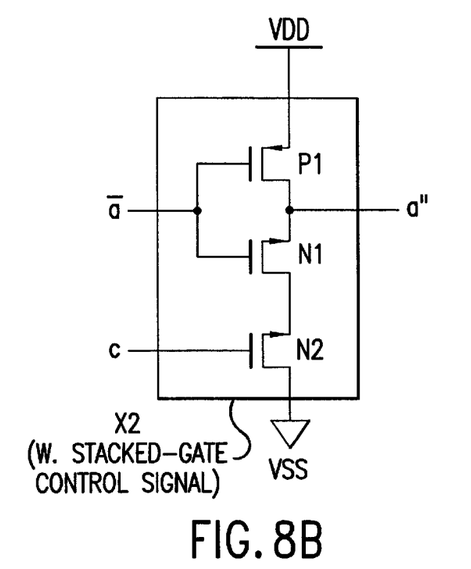
Figure 9B:
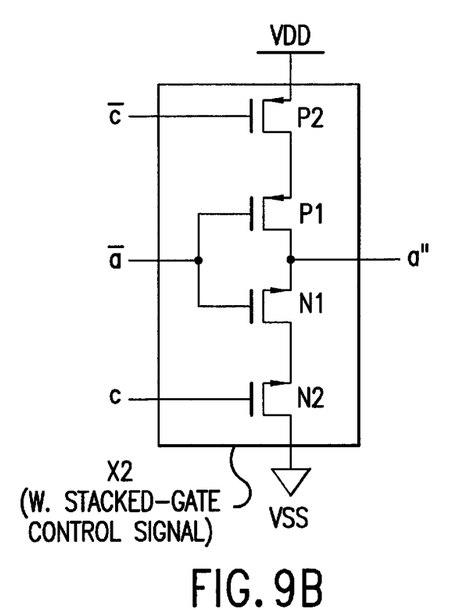

Similarly, the inverting gate X2 can be configured as shown in FIG. 8b or 9b, such that when the signal {c} is at logic "low", no crowbar current can flow directly from VDD to VSS as a result of a floating input (i.e., {a-bar}) of inverting gate X2. The gates X2 shown in FIGS. 8b and 9b are symmetrical to those shown in FIGS. 8a and 9a, and operate in a similar manner.

As with FIG. 6, CMOS transfer gates may be used instead of the blocking transistors {M0, . . . , M7} to preserve the full logic swing of the digital signals {a-bar, b, b-bar} when these digital signals pass therethrough. However, in FIG. 7, the blocking transistors M2 and M6 (for the {a-bar} digital signal lines) can remain as NMOS switching gates since the signal {a-bar} is only used to pass the lower voltage range of {V0, V1, V2, V3} and it is not necessary to have full logic swing. The signal {a} is after the CMOS buffer X1, so the full voltage swing of signal {a} is helpful for passing the higher voltage range {V4, V5, V6, V7}.

Thus, the layout 300 in FIG. 7 eliminates another signal line on either side of the output, so that only a total of 2n−2 signal lines are now needed on each side of the output or layout. This reduction in signal lines further helps to conserve space and minimizes the power consumption of the driver circuit. These savings can be significant. For example, if n=3, the savings in digital-line pitch is 33%.

Even though FIG. 7 illustrates the elimination of the signal lines {a} together with the principles illustrated in connection with FIGS. 5 and 6, it is also possible to apply the principles of FIG. 7 independently without the principles of FIGS. 5 and 6, or in combination with the principles of FIG. 5 only or FIG. 6 only. In addition, even though FIG. 7 illustrates the elimination of the signal lines {a}, this is for illustrative purposes only and is based on the specific layout shown in FIG. 7. Depending on the layout selected by the circuit designer, any of the other digital signal lines {a-bar, b, b-bar, c, c-bar} can be eliminated.

Fourth Embodiment

Figure 10:
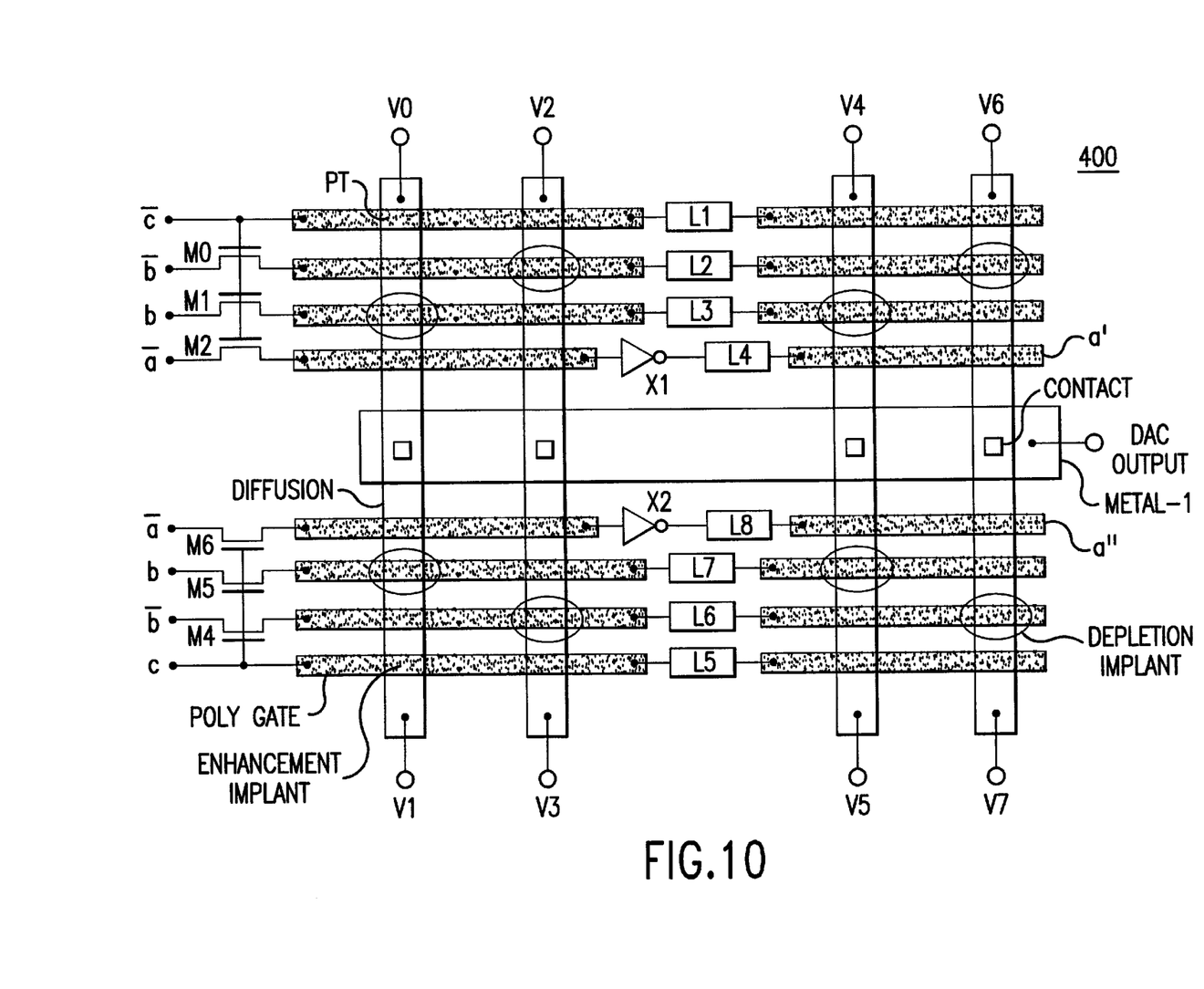
FIG. 10 is a top view of a layout for a driver circuit according to yet another embodiment of the present invention.

FIG. 10 illustrates another possible improvement, which is related to level-shifting a portion of a digital signal line, so as to achieve significant power conservation without affecting the analog-voltage-selection functionality. In this regard, it is well-known that when power consumption P is equal to:

$$P=fcv^2$$

where f is the switching frequency, c is the capacitance, and v is equal to (VH-VL), where VH represents the high voltage level, and VL represents the low voltage level.

For example, for a 5V signal, VH/VL is 5V/0V, and for a 10V signal, VH/VL is 10V/0V. In other words, the power P is proportional to (VH-VL)². Therefore, cutting the voltage swing by half means that power consumption can be reduced to ¼.

The layout 400 in FIG. 10 is essentially the same as in FIG. 7, except that a level-shifter {L1, L2, L3, L4, L5, L6, L7, L8} has been positioned along each digital signal line between the active regions for voltage levels V2 and V4, and between the active regions for voltage levels V3 and V5. The level-shifter can be coupled between two segments of a digital signal line, which might be discontinued between selected active regions to form the two discontinued segments. Further, the level-shifter can be positioned between the active regions for two adjacent voltage levels (e.g., positioned on an actual digital signal between the active regions for two adjacent voltage levels).

As an example, assume that the LCD circuit of FIG. 10 has a full 10-volt range. Since VH−VL is equal to 10 volts, the power required to drive the circuit can be quite high. However, if the voltage levels for {V0, V1, V2, V3} are set at a range of 0–5 volts, for example, and the voltage levels for {V4, V5, V6, V7} are set at a range of 5–10 volts, for example, then much less power is required to drive the circuit because VH−VL would be equal to 5 volts for all voltage levels {V0, V1, V2, V3, V4, V5, V6, V7}. The circuit in FIG. 10 accomplishes this by positioning a level-shifter {L1, L2, L3, L4, L5, L6, L7, L8} on or dividing each digital signal line between the active regions for voltage levels V2 and V4, and between the active regions for voltage levels V3 and V5. Level-shifters L4 and L8 could be coupled to the outputs of the inverting gates X1 and X2, respectively. Each level-shifter {L1, L2, L3, L4, L5, L6, L7, L8} can be implemented in any form that is well-known in the art.

In a preferred embodiment of the present invention, significant power savings can be achieved by using a 0 to 6 volt range for the digital signals {a, a-bar, b, b-bar, c, c-bar} that are used to select the lower-range voltage levels {V0, V1, V2, V3}, and using a 4 to 10 volt range for the digital signals {a, a-bar, b, b-bar, c, c-bar} for selecting the upper-range voltage levels {V4, V5, V6, V7}. The level-shifters {L1, L2, L3, L4, L5, L6, L7, L8} function to shift the voltage range of the digital signals from the 0–6 volt range to the 4–10 volt range. Using the 0–6 volt and 4–10 volt ranges, the power consumption can be reduced by $(6/10)^2 = 36\%$, for a 64% power savings.

Figure 11:
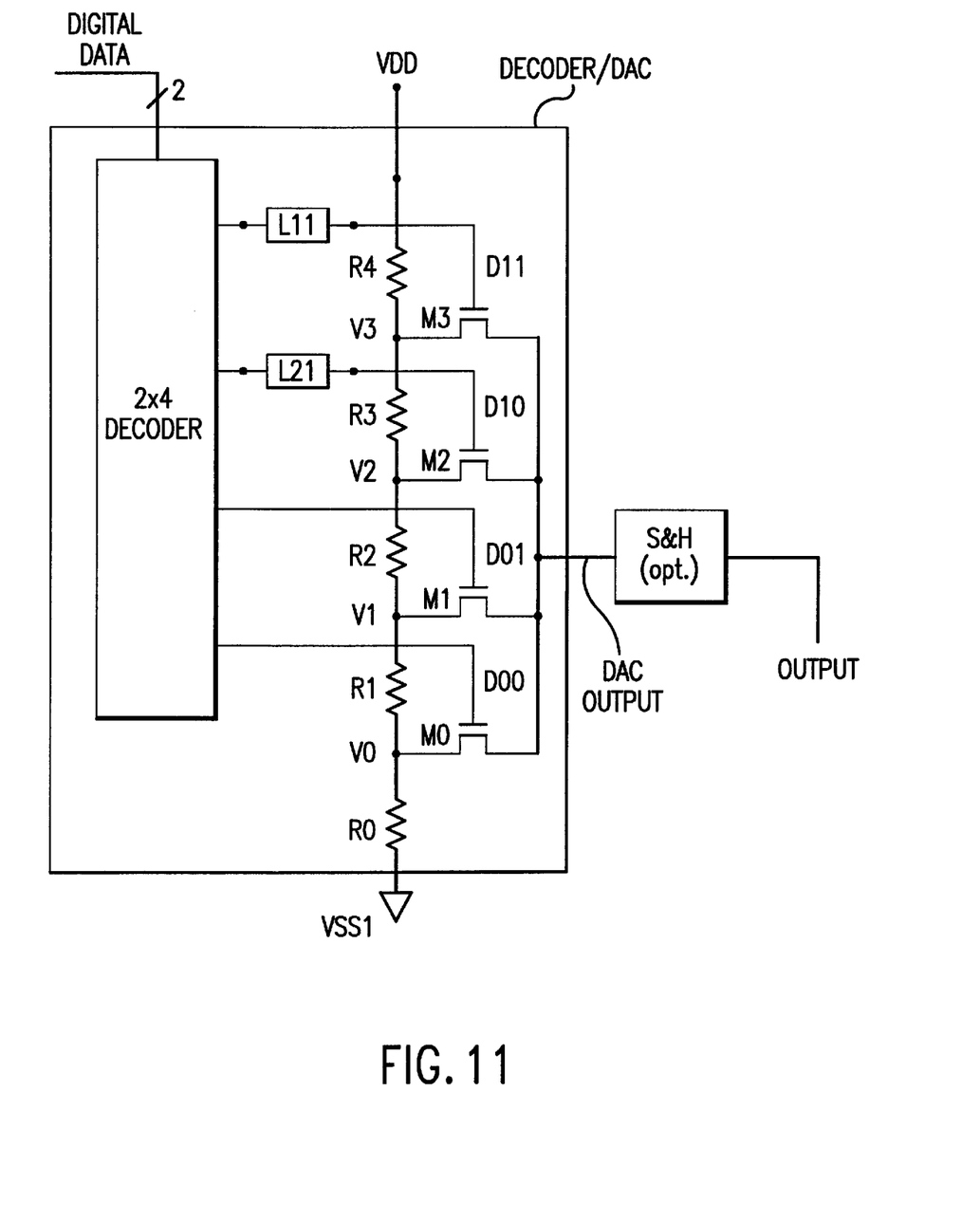
FIG. 11 illustrates an LCD driver according to another embodiment of the present invention.

The concept of level-shifting can also be applied to the circuit of FIG. 1. FIG. 11 illustrates the provision of level-shifters L11 and L21 in the LCD circuit of FIG. 1 to level-shift a subset of digital signals for selecting a subset of voltage levels (here, V3 and V2, respectively).

Even though FIG. 10 illustrates the use of level-shifters together with the principles illustrated in connection with FIGS. 5, 6 and 7, it is also possible to apply the principles of FIG. 10 independently without the principles of FIGS. 5, 6, and 7 or in combination with the principles of one or more of FIGS. 5, 6 and 7.

It will be recognized that the above described invention may be embodied in other specific forms without departing from the spirit or essential characteristics of the disclosure. Thus, it is understood that the invention is not to be limited by the foregoing illustrative details, but rather is to be defined by the appended claims. As one non-limiting example, even though FIGS. 5–7 and 10 have been illustrated as using six digital signal lines {a, a-bar, b, b-bar, c, c-bar} and eight voltage levels {V0, . . . , V7}, it is possible to use any number of digital signal lines and voltage levels (e.g., 2n–x digital signal lines for $2^n$ voltage levels). As another non-limiting example, the principles of the present invention can be applied to general DACs (digital-to-analog converters) with digital decoders and analog voltage outputs.

What is claimed is:

1. A driver circuit for a display, the circuit having an input receiving a digital input data having n bits for selecting one of a plurality of voltage levels for driving the circuit, the circuit having an output, a plurality of digital signal lines coupled to the digital input data, a plurality of active regions coupled to a first side of the output, each of the plurality of active regions coupled to a separate voltage level, the circuit further including a plurality of pass transistors at a first subset of locations where the plurality of digital signal lines overlap the plurality of active regions, a plurality of depletion-implanted transistors at a second subset of locations where the plurality of digital signal lines overlap the plurality of active regions, wherein:
   the number of the plurality of digital signal lines on the first side of the output is an odd number;
   wherein at least one active region has at least one pass transistor and at least one depletion-implanted transistor; and
   wherein n is a positive integer.

2. The circuit of claim 1, wherein the plurality of digital signal lines are polysilicon lines.

3. The circuit of claim 1, wherein the plurality of active regions is a first plurality of active regions, and further including a second plurality of active regions coupled to a second side of the output, and the number of the plurality of digital signal lines on the second side of the output is an odd number.

4. The circuit of claim 1, wherein the number of the plurality of digital signal lines on the first side of the output is equal to 2n−1.

5. The circuit of claim 3, wherein the number of the plurality of digital signal lines on the second side of the output is equal to 2n−1.

6. The circuit of claim 1, wherein said odd number digital signal lines includes a first digital signal line associated with a first digital bit, a second digital signal associated with a second digital bit, and an inverting digital line associated with the second digital bit.

7. A driver circuit for a display, the circuit having an input receiving a digital input data having n bits for selecting one of a plurality of voltage levels for driving the circuit, the circuit having an output, a plurality of digital signal lines coupled to the digital input data, a plurality of active regions coupled to a first side of the output, each of the plurality of active regions coupled to a separate voltage level the circuit further including a plurality of pass transistors at a first subset of locations where the plurality of digital signal lines overlap the plurality of active regions, a plurality of depletion-implanted transistors at a second subset of locations where the plurality of digital signal lines overlap the plurality of active regions, the circuit further including:
   a plurality of blocking transistors positioned between the input and selected digital signal lines, with at least one of the digital signal lines being coupled to a gate of each of the blocking transistors for controlling each of the blocking transistors; and
   wherein n is a positive integer.

8. The circuit of claim 7, wherein the plurality of active regions is a first plurality of active regions, and further including a second plurality of active regions coupled to a second side of the output, and the number of the plurality of digital signal lines on the second side of the output is an odd number.

9. The circuit of claim 7, further including a buffer positioned between the input and each digital signal line, wherein the buffers for the digital signal lines that control the blocking transistors are larger in size than the other buffers.

10. The circuit of claim 7, wherein each blocking transistor is either a NMOS switching gate or a CMOS transfer gate.

11. The circuit of claim 7, wherein the number of the plurality of digital signal lines on the first side of the output is an odd number.

12. The circuit of claim 8, wherein the number of the plurality of digital signal lines on the second side of the output is equal to 2n−1.

13. The circuit of claim 11, wherein the number of the plurality of digital signal lines on the first side of the output is equal to 2n−1.

14. A driver circuit for a display, the circuit having an input receiving a digital input data having n bits for selecting one of a plurality of voltage levels for driving the circuit, the circuit having an output, a plurality of digital signal lines coupled to the digital input data, a plurality of active regions coupled to a first side of the output, each of the plurality of active regions coupled to a separate voltage level, the circuit further including a plurality of pass transistors at a first subset of locations where the plurality of digital signal lines overlap the plurality of active regions, a plurality of depletion-implanted transistors at a second subset of locations where the plurality of digital signal lines overlap the plurality of active regions, wherein:
   the number of the plurality of digital signal lines on the first side of the output is equal to 2n−2;
   wherein at least one active region has at least one pass transistor and at least one depletion-implanted transistor; and
   wherein n is a positive integer that is greater than 1.

15. The circuit of claim 14, wherein the plurality of digital signal lines are polysilicon lines.

16. The circuit of claim 14, wherein the plurality of active regions is a first plurality of active regions, and further including a second plurality of active regions coupled to a second side of the output, and the number of the plurality of digital signal lines on the second side of the output is equal to 2n−2.

17. The circuit of claim 14, wherein a first of the digital signal lines is discontinued between two adjacent active regions to form a first digital segment carrying the digital signal, and a second digital segment carrying a digital signal that is inverted from the digital signal of the first digital segment.

18. The circuit of claim 16, wherein one of the digital signal lines on the second side is discontinued between two adjacent active regions to form a first digital segment carrying the digital signal, and a second digital segment carrying a digital signal that is inverted from the digital signal of the first digital segment.

19. A driver circuit for a display, the circuit having an input receiving a digital input data having n bits for selecting one of a plurality of voltage levels for driving the circuit, the circuit having an output, a plurality of digital signal lines coupled to the digital input data, a plurality of active regions coupled to a first side of the output, each of the plurality of active regions coupled to a separate voltage level, the circuit further including a plurality of pass transistors at a first subset of locations where the plurality of digital signal lines overlap the plurality of active regions, a plurality of depletion-implanted transistors at a second subset of locations where the plurality of digital signal lines overlap the plurality of active regions, wherein:
the number of the plurality of digital signal lines on the first side of the output is equal to 2n−2;
wherein n is a positive integer that is greater than 1; and
a plurality of blocking transistors positioned between the input and selected digital signal lines, with at least one of the digital signal lines being coupled to a gate of each of the blocking transistors for controlling each of the blocking transistors.

20. The circuit of claim 19, further including a buffer positioned between the input and each digital signal line, wherein the buffers for the digital signal lines that control the blocking transistors are larger in size than the other buffers.

21. A driver circuit for a display, the circuit having an input receiving a digital input data having n bits for selecting one of a plurality of voltage levels for driving the circuit, the circuit having an output, a plurality of digital signal lines coupled to the digital input data, a plurality of active regions coupled to a first side of the output, each of the plurality of active regions coupled to a separate voltage level, the circuit further including a plurality of pass transistors at a first subset of locations where the plurality of digital signal lines overlap the plurality of active regions, a plurality of depletion-implanted transistors at a second subset of locations where the plurality of digital signal lines overlap the plurality of active regions, the circuit further including:
at least one level-shifter, each level-shifter associated with a digital signal line;
wherein at least one active region has at least one pass transistor and at least one depletion-implanted transistor; and
wherein n is a positive integer.

22. The circuit of claim 21, wherein a level-shifter is positioned between selected active regions.

23. The circuit of claim 21, wherein the plurality of digital signal lines are polysilicon lines.

24. The circuit of claim 21, wherein the number of the plurality of digital signal lines on the first side of the output is equal to 2n−1.

25. The circuit of claim 21, wherein the number of the plurality of digital signal lines on the first side of the output is equal to 2n−2, and wherein n is a positive integer greater than 1.

26. A driver circuit for a display, the circuit having an input receiving a digital input data having n bits for selecting one of a plurality of voltage levels for driving the circuit, the circuit having an output, a plurality of digital signal lines coupled to the digital input data, a plurality of active regions coupled to a first side of the output, each of the plurality of active regions coupled to a separate voltage level, the circuit further including a plurality of pass transistors at a first subset of locations where the plurality of digital signal lines overlap the plurality of active regions, a plurality of depletion-implanted transistors at a second subset of locations where the plurality of digital signal lines overlap the plurality of active regions, the circuit further including;
at least one level-shifter each level-shifter associated with a digital signal line;
a plurality of blocking transistors positioned between the input and selected digital signal lines, with at least one of the digital signal lines being coupled to a gate of each of the blocking transistors for controlling each of the blocking transistors; and
wherein n is a positive integer.

27. The circuit of claim 21, wherein a first of the digital signal lines is discontinued between two adjacent active regions to form a first digital segment carrying the digital signal, and a second digital segment carrying a digital signal that is inverted from the digital signal of the first digital segment.

28. The circuit of claim 21, wherein the plurality of active regions is a first plurality of active regions, and further including a second plurality of active regions coupled to a second side of the output.

29. The circuit of claim 28, wherein the number of the plurality of digital signal lines on the second side of the output is equal to 2n−2, and wherein n is a positive integer greater than 1.

30. The circuit of claim 28, wherein the number of the plurality of digital signal lines on the second side of the output is equal to 2n−1.

31. The circuit of claim 28, wherein one of the digital signal lines on the second side is discontinued between two adjacent active regions to form a first digital segment carrying the digital signal, and a second digital segment carrying a digital signal that is inverted from the digital signal of the first digital segment.

32. The circuit of claim 21, wherein the digital signal line has at least two discontinued segments, with a level shifter coupling between the the discontinued segments.

* * * * *